United States Patent

Price, Jr.

[11] Patent Number: 5,872,477
[45] Date of Patent: Feb. 16, 1999

[54] MULTIPLEXER WITH CMOS BREAK-BEFORE-MAKE CIRCUIT

[75] Inventor: John J. Price, Jr., Edina, Minn.

[73] Assignee: VTC Inc., Bloomington, Minn.

[21] Appl. No.: 874,242

[22] Filed: Jun. 13, 1997

[51] Int. Cl.$^6$ .......................... H03K 17/16; H03K 17/76
[52] U.S. Cl. .......................... 327/392; 327/399; 327/400; 327/410; 327/409
[58] Field of Search .................................. 327/392, 398, 327/399, 400, 407, 408, 409, 410

[56] References Cited

U.S. PATENT DOCUMENTS

| | | | |
|---|---|---|---|
| 4,001,610 | 1/1977 | Griffin | 307/293 |
| 4,047,055 | 9/1977 | Romano | 307/262 |
| 4,408,137 | 10/1983 | Fox | 307/598 |
| 4,550,291 | 10/1985 | Millaway et al. | 330/277 |
| 4,583,037 | 4/1986 | Sooch | 323/315 |
| 4,587,495 | 5/1986 | Osawa et al. | 330/311 |
| 4,612,452 | 9/1986 | Stefani et al. | 307/300 |
| 4,625,155 | 11/1986 | Dietz | 315/408 |
| 4,647,794 | 3/1987 | Guajardo | 307/311 |
| 4,697,153 | 9/1987 | Lish | 330/277 |
| 4,700,086 | 10/1987 | Ling et al. | 307/443 |
| 4,700,282 | 10/1987 | Menniti et al. | 363/56 |
| 4,985,703 | 1/1991 | Kaneyama | 341/141 |
| 5,049,835 | 9/1991 | Vasile | 330/277 |
| 5,051,630 | 9/1991 | Kogan et al. | 307/603 |
| 5,055,705 | 10/1991 | Hall | 307/296.4 |
| 5,111,072 | 5/1992 | Seidel | 307/353 |
| 5,126,596 | 6/1992 | Millman | 307/451 |
| 5,162,666 | 11/1992 | Tran | 307/243 |
| 5,257,146 | 10/1993 | Price, Jr. et al. | 360/67 |
| 5,280,196 | 1/1994 | Shinozaki | 307/270 |
| 5,281,862 | 1/1994 | Ma | 307/270 |
| 5,296,975 | 3/1994 | Contreras et al. | 360/46 |
| 5,332,916 | 7/1994 | Hirai | 257/369 |
| 5,352,933 | 10/1994 | Kogan | 307/268 |
| 5,430,408 | 7/1995 | Ovens et al. | 327/404 |
| 5,463,343 | 10/1995 | Marbot | 327/270 |
| 5,513,175 | 4/1996 | Ichii et al. | 370/17 |
| 5,541,526 | 7/1996 | Sandhu | 326/17 |

*Primary Examiner*—Timothy P. Callahan
*Assistant Examiner*—An T. Luu
*Attorney, Agent, or Firm*—Kinney & Lange, P.A.

[57] ABSTRACT

A multiplexer selectively connects one of first and second nodes to a third node. The multiplexer includes a first switch coupled between the first and third nodes, a second switch coupled between the second and third nodes, and a control input for receiving a signal to either open the first switch and close the second switch or open the second switch and close the first switch. Additionally, a delay circuit, coupled to the control input and the second switch, delays closure of the second switch until the first switch is open. In a preferred embodiment, the delay circuit includes two field-effect transistors having substantially different width-to-length ratios.

19 Claims, 3 Drawing Sheets

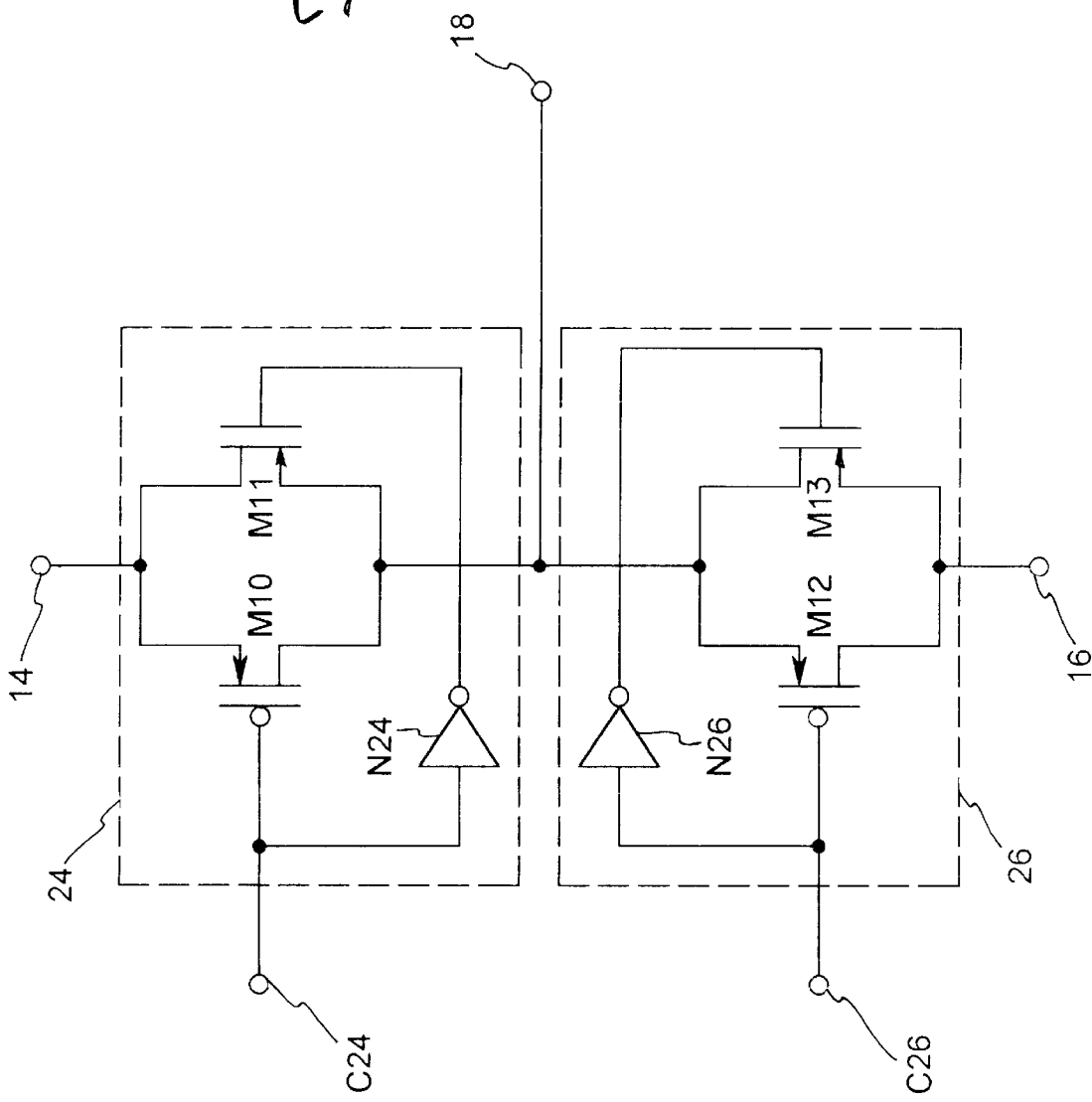

5,872,477

MULTIPLEXER WITH CMOS BREAK-BEFORE-MAKE CIRCUIT

BACKGROUND OF THE INVENTION

This invention concerns electronic switches, particularly multiplexers and demultiplexers.

A multiplexer is a circuit with two or more electronic switches that selectively connects one input pin to one of several output pins, and a demultiplexer is a circuit with two or more switches that selectively connects one of several input pins to one output pin. For example, a two-to-one multiplexer includes two switches: one connected between a first input pin and an output pin, and the other connected between a second input pin and the output pin. The two switches are connected also to a control pin which receives a control signal for alternately opening and closing the two switches.

Applying a relatively-high-voltage control signal to the control pin causes the multiplexer to connect the first input pin to the output pin, whereas applying a relatively-low-voltage control signal connects the second input pin to the output pin. A one-to-two demultiplexer, which has one input pin and first and second output pins, works similarly. Because many multiplexers can operate as demultiplexers by simply using their inputs as outputs, the term multiplexer broadly refers to both multiplexers and demultiplexers.

In practice, many multiplexers suffer from transient simultaneous input-output connections which momentarily connect an output pin to, not one, but two input pins. These simultaneous connections stem from delays in opening, or breaking, an existing input-output connection. The delays are inherent to the transistors forming the electronic switches of typical multiplexers. The transistors include structural, or parasitic, capacitances which require charging or discharging to break their input-output connections. The charging and discharging occurs for a period of time during which the associated switch remains closed. Since the switches of the multiplexer typically respond in unison to a control signal, one switch is closing, or "making," a connection while another switch is simultaneously opening, or "breaking," its connection, setting up a race condition between the opening and the closing switches. If the closing switch makes its particular input-output connection before the opening switch breaks its connection, simultaneous connection results.

Simultaneous connections are undesirable because they can damage the multiplexer or circuitry coupled to its inputs or outputs. For instance, in a five-volt disk drive system which uses a two-to-one multiplexer to selectively connect a particular circuit node to either five or zero volts, momentarily connecting both the five-volt and the zero-volt input pins to the output pin short-circuits the power supply, causing a large current spike which could destroy not only the multiplexer but other circuitry in the disk drive.

Thus, as a safeguard against undesirable simultaneous connections, a multiplexer needs a "break-before-make" circuit for breaking one input-output connection before making another input-output connection.

SUMMARY OF THE INVENTION

Accordingly, the invention is a multiplexer having a break-before-make circuit for preventing undesirable simultaneous connections. Specifically, the multiplexer, which selectively connects one of first and second pins to a third pin, includes first and second switches and a delay circuit. The delay circuit delays the second switch from connecting the second and third pins until the second switch has disconnected the first and third pins, thereby preventing simultaneous connection of the first and second pins to the third pin.

In a preferred embodiment, the delay circuit includes two field-effect transistors having substantially different width-to-length ratios. The field-effect transistors are preferably connected in cascode with the transistor having the smaller width-to-length ratio driving the larger transistor. In addition, a current mirrored to the two field-effect transistors controls duration of the delay.

BRIEF DESCRIPTION OF THE DRAWINGS

FIG. 3 is an electrical schematic showing the presently-preferred embodiment of the two switches in FIG. 1.

DETAILED DESCRIPTION OF THE PREFERRED EMBODIMENTS

Figure 1:
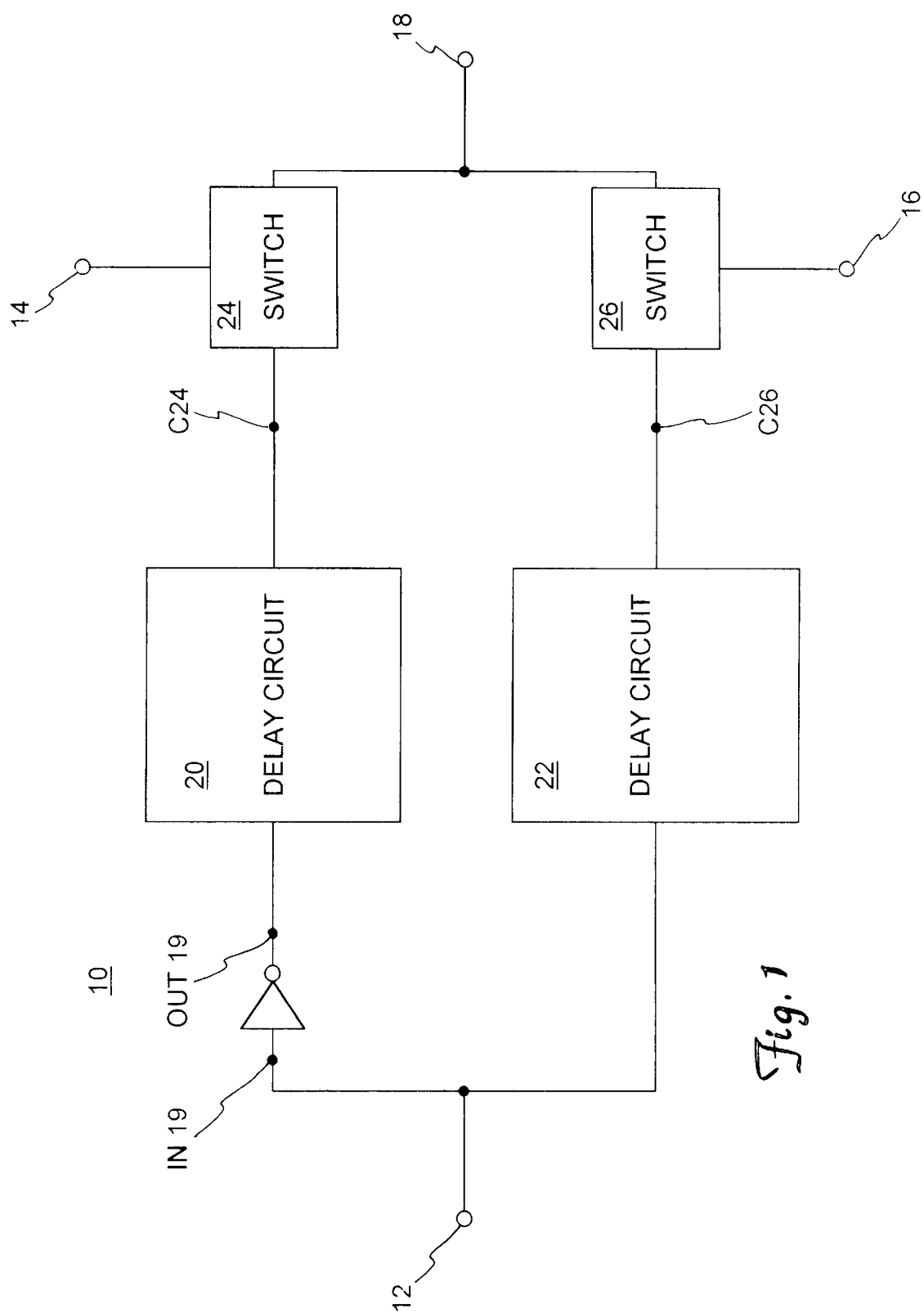
FIG. 1 is a block diagram illustrating a two-to-one multiplexer that incorporates the general teachings of the present invention.

FIG. 1, which illustrates a general embodiment of the present invention, shows a two-to-one multiplexer 10 including two switches 24 and 26 and a break-before-make circuit comprising two delay circuits 20 and 22. Multiplexer 10 has four pins or nodes: a control pin 12, respective first and second pins 14 and 16 which preferably serve as inputs, and a third pin 18, which preferably serves as an output. Multiplexer 10 also includes an inverter 19 having an input connected to control pin 12 and an output connected to delay circuit 20.

Delay circuit 20 is connected between control pin 12 (via inverter 19) and a control node C24 of switch 24. Delay circuit 22 is connected between control pin 12 and a control node 26 of switch 26. Switches 24 and 26, respectively connected between pins 14 and 18 and between pins 16 and 18, are preferably active-low switches, with low signals at control nodes C24 and C26 causing them to close and high signals causing them to open. Opening switch 24, for example, increases conductance between pins 14 and 18, and closing it decreases conductance between these pins. Switch 26 operates similarly.

In steady-state operation, multiplexer 10 operates as a typical multiplexer, with inverter 19 ensuring complementary operation of switches 24 and 26. A low select signal at control pin 12 keeps switch 24 open and switch 26 closed whereas a high select signal at pin 12 keeps switch 24 closed and switch 26 open. In steady-state, delay circuits 20 and 22 hold respective control nodes C24 and C26 at the high or low voltages necessary to maintain the desired switch states. However, in transient operation, that is, in response to control signal transitions, delay circuits 20 and 22 delay closure of respective switches 24 and 26 for respective independent delay periods, to prevent simultaneous connections.

Specifically, a low-to-high control signal transition at control pin 12 directs delay circuit 22 to open switch 26 and forces inverter 19 to send a low output signal to delay circuit 20. After a delay, or waiting period, elapses, delay circuit 20 closes switch 24. Hence, switch 26 disconnects pin 16 from pin 18, before switch connects pin 14 to pin 18.

Conversely, a high-to-low control signal transition at control pin 12 causes delay circuit 20 to open switch 24, and delay circuit 22 allows a waiting period, similar to that of delay circuit 20, to elapse before closing switch 26. Thus, for both low-to-high and high-to-low control signal transitions, delay circuits 20 and 22 delay closure of respective switches 24 and 26 until the respective counterpart switch is open, thereby preventing undesirable simultaneous connections and safeguarding the multiplexer and other interconnected circuitry.

Figure 2:
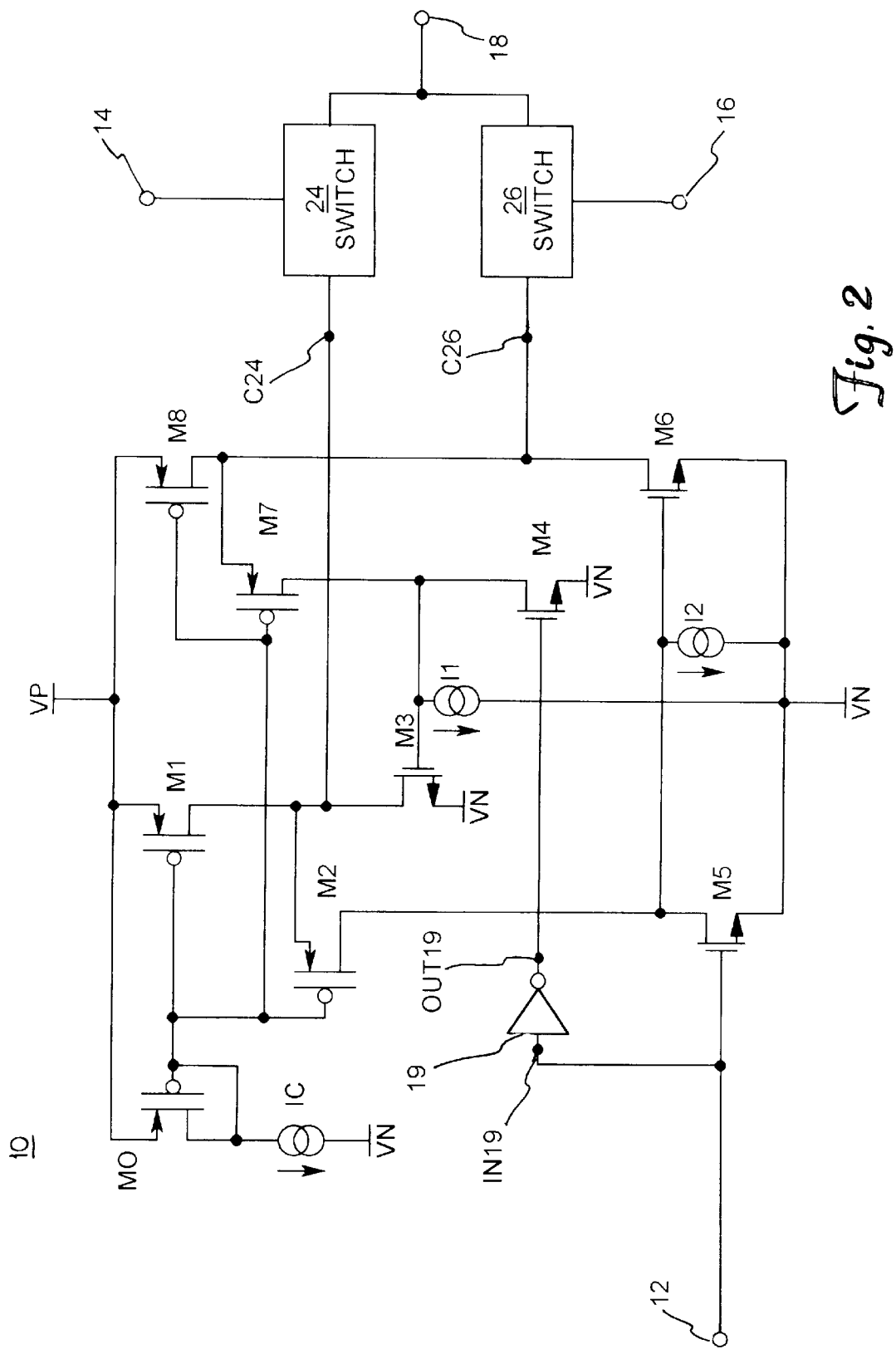
FIG. 2 is an electrical schematic showing the presently-preferred embodiment of the delay circuits in FIG. 1.

FIG. 2 illustrates a preferred "complementary metal oxide semiconductor" (cmos) embodiment of delay circuits 20 and 22. In particular, delay circuit 20 includes "mos field effect transistors" (mosfets) M0–M6, current generators I1, I2 and IC, and positive and negative supply nodes VP and VN. And, delay circuit 22 includes mosfets M0 and M3–M8, current generators I1, I2, and IC, and supply pins (or nodes) VP and VN. Hence, in this preferred cmos embodiment, the two delay circuits share mosfets M0, M3–M6, current generators I1, I2, and IC, and supply nodes VP and VN. This sharing, however, is not essential, as separate components can be used for each delay circuit The following table describes the preferred types (that is, polarity) and the effective width-to-length ratios (WTLs) for the channel of each mosfet.

| mosfet | type | WTL |
|--------|------|------|
| M0 | P | 1 |
| M1 | P | 2 |
| M2 | P | 6.8 |
| M3 | N | 2.83 |
| M4 | N | 2.83 |
| M5 | N | 2.83 |
| M6 | N | 2.83 |
| M7 | P | 6.8 |
| M8 | P | 2 |

The WTL of 1 is implemented as 7:7, the WTL of 2 as 14:7, the WTL of 6.8 as 17:2.5, and the WTL of 2.83 as 17:6. To simplify fabrication, each channel preferably has the same thickness.

Supply pins VP and VN preferably have respective voltages VP and VN of 12 and 0 volts, which establish an acceptable range of voltages for pins 14 and 16. (Voltage VP, however, can be any value greater than or equal to 3.3 volts.) Current generators I1, I2 and IC, each of which preferably draws a current of 10 micro-amperes, include respective pairs of positive and negative nodes: I1P–I1N, I2P–ICN, and ICP–ICN. Mosfets M0–M8 have respective gates G0–G8, drains D0–D8, and sources S0–S8. For clarity, these reference numerals are not shown in the figure. Also not shown in the figure are the substrates of the mosfets and connection of the substrates to positive supply node VP.

As FIG. 2 shows, mosfet M0 has its source S0 coupled to positive supply node VP, and its gate G0 and drain D0 coupled not only to negative supply node VN via current generator IC, but also to gates G1, G2, G7, and G8 (the gates of mosfets M1, M2, M7, and M8). Mosfet M0 and respective mosfets M1, M2, M7, and M8 form four one-to-two current mirrors, which mirror the current of current generator IC, preferably 10 micro-amperes, to these mosfets. In this embodiment, current generator IC sets the delay of both delay circuits. However, it is equally feasible to control the delay of each delay circuit separately.

Mosfet M1 has its source S1 connected to supply node VP, and its drain D1 coupled the source of mosfet M2. Mosfet M2 has its source S2 connected to control node C24 and to drain D3, the drain of mosfet M3. Source S3 is connected to supply node VN, and gate G3 is connected not only to supply node VN via current generator I1 but also to the drains of mosfets M4 and M7. The source of mosfet M4 is connected to node VN, and the gate of mosfet M4 is connected to OUT19, the output of inverter 19.

Mosfet M5 has its gate connected to control pin 12, its source connected to node VN, and its drain connected to both the drain of mosfet M2 and the gate of mosfet M6. Mosfet M6 has its source connected to node VN, and its drain connected not only to control node C26, but also to the source of mosfet M7 and the drain of mosfet M8. Drain D7 is connected both to gate G3 and to drain D4, and source S8 is connected to node VP.

FIG. 2 shows current generator IC connected between drain D0 and supply node VN, and current generator I1 connected between gate G3 and supply node VN. Current generator I2 is connected between node VN and gate G6.

The following table further describes specific interconnections of the mosfets M0–M8, current generator nodes pairs I1P–I1N, I2P–I2N, and ICP–ICN, switch control nodes C24 and C26, and voltage supply pins VP and VN.

| part | Gate | Drain | Source | Pos | Neg |
|------|------|-------|--------|-----|-----|
| M0 | D0,G1 | G0 | VP | — | — |
| M1 | G2,G7 | S2,D3 | VP | — | — |
| M2 | G1,G7 | D5,G6 | D1,C24 | — | — |
| M3 | D4,D7 | S2,C24 | VN | — | — |
| M4 | OUT19 | G3,D7 | VN | — | — |
| M5 | 12,IN19 | D2,G6 | VN | — | — |
| M6 | D5,I2P | D8,C26 | VN | — | — |
| M7 | G2,G8 | G3,D4 | D8 | — | — |
| M8 | G2,G7 | D6,C26 | VN | — | — |
| I1 | — | — | — | G3,D4 | VN |
| I2 | — | — | — | D5,G6 | VN |
| IC | — | — | — | G0,D0 | VN |

Of these connections, the most important to operation of the delay circuits are the connection of mosfets M1 and M2, and the connection of mosfets M7 and M8. Mosfet M2 has a substantially larger WTL than mosfet M1 (6.8 versus 2). Thus, mosfet M2 turns on at a lower gate-to-source voltage than mosfet M1, allowing mosfet M1 to operate near its saturation region at a preferred current level of 20 micro-amperes (the same current conducted by mosfet M2). Likewise, because mosfet M7 has a substantially larger WTL than mosfet M8 (6.8 versus 2), mosfet M7 turns on at a lower gate-to-source voltage than mosfet M8, allowing mosfet M8 to operate in near saturation with a preferred current level of 20 micro-amperes.

The preferred cmos embodiment of FIG. 2 operates as follows. A high-to-low control signal transition at control pin 12, causes inverter 19 to activate mosfet M4, which in turn deactivates mosfet M3. Deactivating mosfet M3 causes its drain voltage (the voltage at drain D3) and the voltage at control node C24 to increase, or rise, toward voltage VP, thereby initiating the deactivation, or opening, of switch 24 (which opens with high signals). When the voltage at drain D3 reaches a threshold value (within tens of millivolts of voltage VP), mosfet M2 begins to turn on and thus progressively conducts an increasing portion of current from mosfet M1 (which remains in saturation because it requires a lower gate-to-source voltage to turn on than the larger mosfet M2).

When mosfet M2 is fully turned on, the voltage at drain D3 is approximately equal to voltage VP. At this point, switch 24 (an active-low switch) is completely open, and mosfet M6 turns on and decreases the voltage at control node C26, thereby initiating the closure of switch 26. Thus, the preferred cmos implementation of delay circuit 22 ensures that switch 24 opens, or breaks, the connection of nodes 14 and 18 before switch 26 makes its connection of nodes 16 and 18.

Conversely, a low-to-high control signal transition activates mosfet M5 and deactivates mosfet M6. Deactivating mosfet M6 raises the voltage at drain D6 and at control node C26 toward voltage VP, thereby initiating the opening of switch 26 (which opens with high signals). Mosfet M7, with its source S7 connected to drain D6, begins to turn on when the voltage at drain D6 (and source S7) reaches a threshold value, within tens of millivolts of voltage VP. When mosfet M7 is completely turned on, the connection of pins 16 and 18 through switch 26 is open, and mosfet M7 activates mosfet M3 which in turn lowers the voltage at control node C24, thereby closing switch 24 and connecting pins 14 and 18. Thus, switch 26 breaks the connection of nodes 16 and 18 before switch 24 connects nodes 14 and 18.

FIG. 3 shows the preferred embodiment of switches 24 and 26 as well-known active-low transmission gates which include respective mosfet pairs M10, M11 and M12, M13 and respective inverters N24 and N26. It is equally feasible to use other types of electronic switches.

Although the present invention has been described with reference to preferred embodiments, workers skilled in the art will recognize that changes may be made in form and detail without departing from the spirit and scope of the invention. For example, other types of appropriately sized and biased transistors, such as bipolar junction transistors, may be used to implement the delay circuits of the present invention. These and other changes are within the spirit and scope of the present invention as defined in the following claims.

What is claimed is:

1. A multiplexer for selectively connecting one of first and second nodes to a third node, the multiplexer comprising:
   a first switch coupled between the first node and the third node;
   a second switch coupled between the second node and the third node;
   a control input for receiving a signal to selectively open the first switch and close the second switch, or to open the second switch and close the first switch;
   a first delay circuit coupled to the control input and the first and second switches, the first delay circuit comprising:
      a first field-effect transistor having a first width-to-length ratio, the first field-effect transistor having a gate, drain and source and being operable in response to the control signal to selectively open the second switch and
      a second field-effect transistor coupled to the first field-effect transistor and having a second width-to-length ratio substantially larger than the first width-to-length ratio, the second field-effect transistor having a gate, drain and source and being responsive to operation of the first field effect transistor to close the first switch, whereby closing of the first switch is delayed until the second switch is open; and
   a second delay circuit coupled to the control input and the first and second switches, the second delay circuit comprising:
      a third field-effect transistor having a third width-to-length ratio, the third field-effect transistor having a gate, drain and source and being operable in response to the control signal to selectively open the first switch, and
      a fourth field-effect transistor coupled to the third field-effect transistor and having a fourth width-to-length ratio substantially larger than the second width-to-length ratio, the fourth field-effect transistor having a gate, drain and source and being responsive to operation of the third field effect transistor to close the second switch, whereby closing of the second switch is delayed until the first switch is open.

2. The multiplexer of claim 1 wherein the second width-to-length ratio is at least twice the first width-to-length ratio, and the fourth width-to-length ratio is at least twice the third width-to-length ratio.

3. The multiplexer of claim 1 wherein the gate of the first field-effect transistor is coupled to the gate of the second field-effect transistor, the drain of the first field-effect transistor is coupled to the source of the second field-effect transistor, the gate of the third field-effect transistor is coupled to the gate of the fourth field-effect transistor, and the drain of the third field-effect transistor is coupled to the source of the fourth field-effect transistor.

4. The multiplexer of claim 1 including:
   a current generator coupled to at least the first and third field-effect transistors.

5. An apparatus for selectively connecting one of first and second nodes to a third node, the apparatus comprising:
   a first switch coupled between the first node and the third node to increase or decrease conductance between the first and third nodes;
   a second switch coupled between the second node and the third node to increase or decrease conductance between the second and third nodes;
   a control input coupled to the first and second switches for receiving a first control signal for selectively operating the first switch to decrease conductance between the first and third nodes and for receiving a second control signal for selectively operating the second switch to decrease conductance between the second and third nodes; and
   a first delay circuit coupled to the control input and the first and second switches, the first delay circuit including:
      a first field-effect transistor having a first width-to-length ratio, the first field-effect transistor having a gate, drain and source and being operable in response to the first control signal to operate the first switch to decrease conductance between the first and third nodes; and
      a second field-effect transistor coupled to the first field-effect transistor and having a second width-to-length ratio substantially different from the first width-to-length ratio, the second field-effect transistor having a gate, drain and source and being responsive to operation of the first field effect transistor to operate the second switch to increase conductance between the second and third nodes, whereby increased conductance of the first is delayed until the conductance of the second switch is decreased; and
   a second delay circuit coupled to the control input and the first and second switches, the second delay circuit including:
      a third field-effect transistor having a third width-to-length ratio, the third field-effect transistor having a gate, drain and source and being operable in response to the second control signal to operate the second switch to decrease conductance between the second and third nodes; and
      a fourth field-effect transistor coupled to the third field-effect transistor and having a fourth width-tolength ratio substantially different from the third width-to-length ratio, the fourth field-effect transistor having a gate, drain and source and being responsive to operation of the third field effect transistor to operate the first switch to increase conductance between the first and third nodes, whereby increased conductance of the second switch is delayed until the conductance of the first switch is decreased.

6. The apparatus of claim 5 wherein the gate of the first field-effect transistor is connected to the second gate of the second field-effect transistor, the drain of the first field-effect transistor is connected to the source of the second field-effect transistor, the gate of the third field-effect transistor is connected to the gate of the fourth field-effect transistor, and the drain of the third field-effect transistor is connected to the source of the fourth field-effect transistor.

7. The apparatus of claim 5 including a current generator for establishing a current in the first, second, third and fourth field-effect transistors.

8. The apparatus of claim 7, including a current mirror for mirroring current from the current generator to the first, second, third and fourth field-effect transistors.

9. The apparatus of claim 5 wherein the second width-to-length ratio is at least twice the first width-to-length ratio and the fourth width-to-length ratio is at least twice the third width-to-length ratio.

10. The apparatus of claim 5 wherein the first and second switches respectively comprise first and second transmission gates.

11. The apparatus of claim 5 wherein the first and third width-to-length ratios are substantially equal and the second and fourth width-to-length ratios are substantially equal.

12. The apparatus of claim 5 further including:
a fifth field-effect transistor having gate and having a drain connected to the source of the second field-effect transistor and the drain of the first field-effect transistor;
a sixth field-effect transistor having a gate and having a drain connected to the source of the fourth field-effect transistor and the drain of the third field-effect transistor; and
a first current generator connected to the gate of the fifth field-effect transistor.

13. The apparatus of claim 12 further including:
a seventh field-effect transistor having a gate connected to the control input, and a drain connected to the second drain;
an eighth field-effect transistor having a gate connected to the control input, and a drain connected to the drain of the fourth field-effect transistor; and
a second current generator coupled to the gate of the sixth field-effect transistor.

14. Apparatus comprising:
a control input for receiving a control signal;
first, second, and third nodes;
a first switch coupled between the first and third nodes; and
a second switch coupled between the second and third nodes;

a delay circuit coupled to the control input, the delay circuit including:
a first field-effect transistor having a first width-to-length ratio, the first field-effect transistor having a gate, drain and source and being operable in response to the control signal to selectively operate the first switch to open electrical connection between the first and third nodes; and
a second field-effect transistor coupled to the first field-effect transistor and having a second width-to-length ratio substantially different from the first width-to-length ratio, the second field-effect transistor having a gate, drain and source and being response to operation of the first field effect transistor to operate the second switch to close electrical connection between the second and third nodes, whereby closing of the electrical connection between the second and third nodes is delayed until the electrical connection between the first and third nodes is open; and
a third field-effect transistor having a gate, drain and source and a current generator which provides a selected current, with the third field-effect transistor coupled between the current generator and the first and second field-effect transistors to mirror the selected current to the first and second field-effect transistors.

15. The apparatus of claim 14 wherein the gate of the first field-effect transistor is coupled to the gate of the second field-effect transistor and the drain of the first field-effect transistor is coupled to the source of the second field-effect transistor.

16. The apparatus of claim 13 wherein the first current generator is connected to the drain of the fourth field-effect transistor and the second current generator is connected to the drain of the second field-effect transistor.

17. The apparatus of claim 6 further including:
a fifth field-effect transistor having gate and having a drain connected to the source of the second field-effect transistor and the drain of the first field-effect transistor;
a sixth field-effect transistor having a gate and having a drain connected to the source of the fourth field-effect transistor and the drain of the third field-effect transistor; and
a first current generator connected to the gate of the fifth field-effect transistor.

18. The apparatus of claim 17 further including:
a seventh field-effect transistor having a gate connected to the control input, and a drain connected to the drain of the second field-effect transistor;
an eighth field-effect transistor having a gate connected to the control input, and a drain connected to the drain of the fourth field-effect transistor; and
a second current generator coupled to the gate of the sixth field-effect transistor.

19. The apparatus of claim 18 wherein the first current generator is connected to the drain of the fourth field-effect transistor and the second current generator is connected to the drain of the second field-effect transistor.

* * * * *

UNITED STATES PATENT AND TRADEMARK OFFICE
CERTIFICATE OF CORRECTION

PATENT NO. : 5,872,477
DATED :
INVENTOR(S) : FEBRUARY 16, 1999

JOHN J. PRICE JR.

It is certified that error appears in the above-identified patent and that said Letters Patent is hereby corrected as shown below:

Col. 5, line 49, delete "switch", insert --switch,--

Signed and Sealed this

Nineteenth Day of October, 1999

Attest:

Q. TODD DICKINSON

*Attesting Officer*    Acting Commissioner of Patents and Trademarks